United States Patent
Tohgoh et al.

(10) Patent No.: US 6,819,840 B2
(45) Date of Patent: Nov. 16, 2004

(54) OPTICAL TRANSMITTING/RECEIVING MODULE AND METHOD FOR MANUFACTURING THE SAME

(75) Inventors: Hitomaro Tohgoh, Yokohama (JP); Hiroaki Asano, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/176,106

(22) Filed: Jun. 21, 2002

(65) Prior Publication Data

US 2003/0012507 A1 Jan. 16, 2003

(30) Foreign Application Priority Data

Jun. 25, 2001 (JP) ........................................ 2001-191898

(51) Int. Cl.[7] ................................................ G02B 6/30
(52) U.S. Cl. ............................ 385/49; 385/47; 385/88; 385/129
(58) Field of Search ............................ 385/47, 49, 88, 385/89, 129–132

(56) References Cited

U.S. PATENT DOCUMENTS

| | | | | |
|---|---|---|---|---|
| 4,210,923 A | * | 7/1980 | North et al. | 257/432 |
| 5,909,523 A | * | 6/1999 | Sakaino et al. | 385/49 |
| 6,374,021 B1 | * | 4/2002 | Nakanishi et al. | 385/49 |
| 6,406,196 B1 | * | 6/2002 | Uno et al. | 385/89 |

FOREIGN PATENT DOCUMENTS

| | | | | |
|---|---|---|---|---|
| JP | 11-068705 | | 3/1999 | |
| WO | WO 9706458 A1 | * | 2/1997 | ............ G02B/6/42 |

* cited by examiner

*Primary Examiner*—Tarifur R. Chowdhury
*Assistant Examiner*—Michael H Caley
(74) *Attorney, Agent, or Firm*—Louis Woo

(57) ABSTRACT

The present invention discloses an optical transmitting/receiving module designed in small size and produced at low cost without the need to use an optical waveguide, which requires complicated process and larger area, and the invention also discloses a method for manufacturing such an optical transmitting/receiving module. According to the present invention, a V-groove running in linear direction and a vertical groove (a groove having vertical side surfaces) crossing obliquely said V-groove at the end of the V-groove, an optical fiber core is arranged to the end of the V-groove, a wavelength selective filter is arranged in the vertical groove, and a light emitting element and a light receiving element are arranged respectively in transmitting direction and reflecting direction of the wavelength selective filter.

10 Claims, 8 Drawing Sheets

FIG. 2A
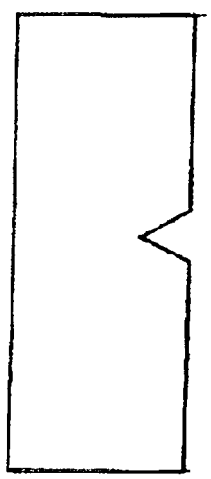
FIG. 2B
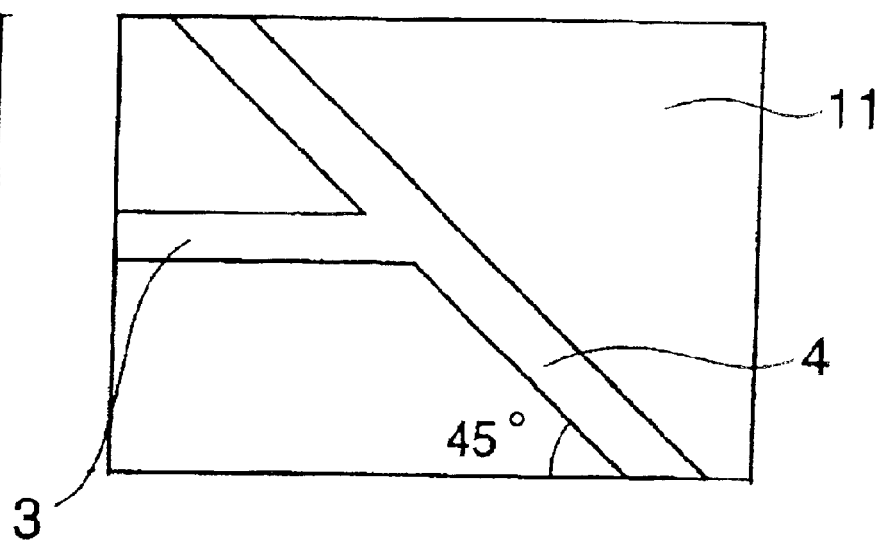
FIG. 2C

FIG. 3
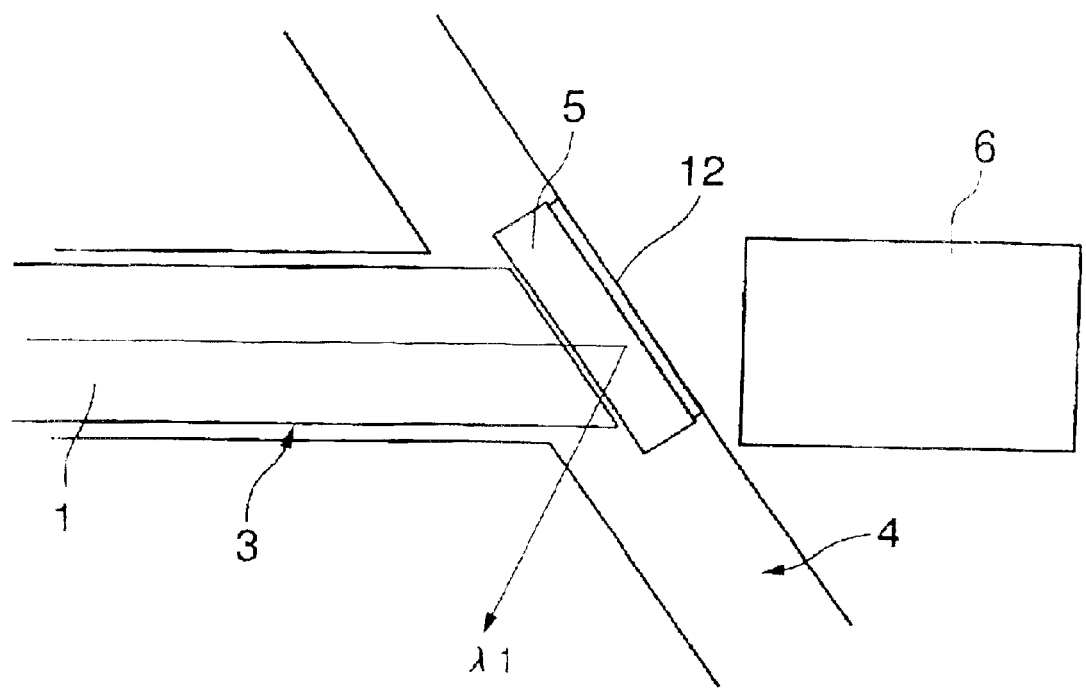
FIG. 4A
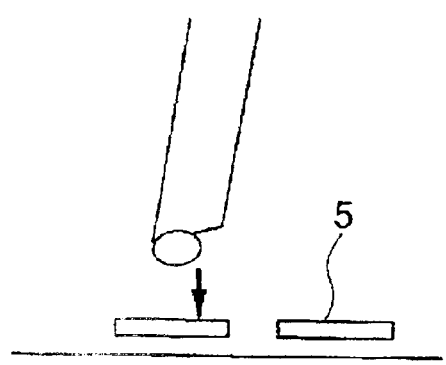
FIG. 4C
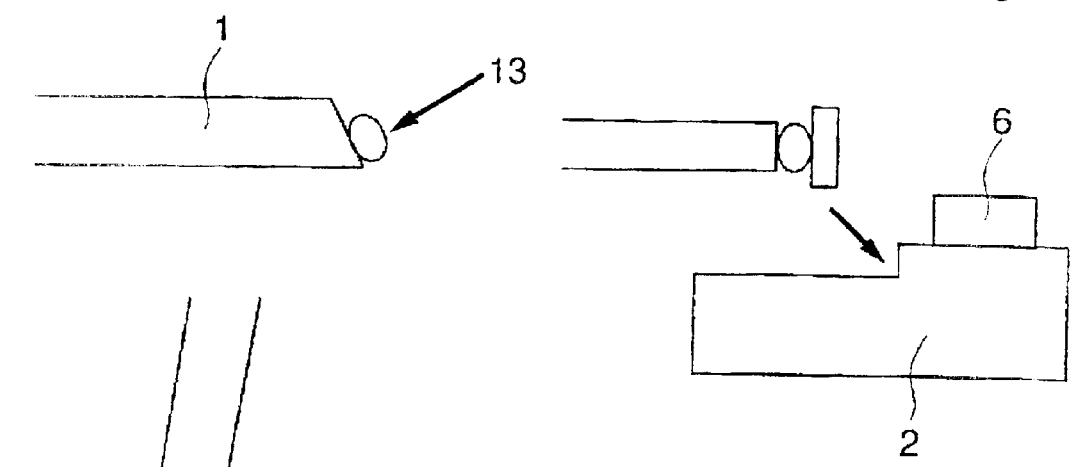
FIG. 4B

OPTICAL TRANSMITTING/RECEIVING MODULE AND METHOD FOR MANUFACTURING THE SAME

BACKGROUND OF THE INVENTION

1. Field of the Invention

The present invention relates to an optical transmitting/receiving module to be used in optical fiber communication and to a method for manufacturing the same.

2. Description of the Related Art

In recent years, attention has been focused on optical fiber communication, by which an information of large capacity can be transmitted at high speed and with low loss and which uses optical fiber instead of metallic cable. With the progress of technique, there are now strong demands on optical devices, which can be produced at lower cost and are provided with high functions for high-speed transmission. For instance, efforts have now been made to develop an optical communication system, by which optical bidirectional transmission in outgoing and incoming directions with different wavelengths of $\lambda 1$ and $\lambda 2$ can be achieved using a single optical fiber. To produce an optical module of this type, it is necessary to use a technique to separate the wavelength of a light emitting element from that of a light receiving element and to integrate components with optical multiplexing function.

Description will be given below on a typical example of a conventional type optical bidirectional module. In the past, a structure combining an optical waveguide with a wavelength division multiplexing (WDM) filter has been commonly used to separate a signal of receiving wavelength $\lambda 1$ from a signal of transmitting wavelength $\lambda 2$. FIG. 11 shows a conventional structure of a WDM optical bidirectional module using optical waveguide disclosed in JP-A-11-68705. On a Si substrate 103, optical waveguides 102 (102a, 102b, 102c) are formed in star-like arrangement with a WDM filter 107 at the center. To an end of each of the optical waveguides 102a, 102b and 102c, a light emitting element 105, a light receiving element 106, and an optical fiber 101 are aligned by 2-dimensional high-accuracy alignment to achieve optical coupling of incident light with exit light. The alignment of the light emitting element 105 and the light receiving element 106 is generally performed by using alignment markers, which are formed in advance with high accuracy on the Si substrate 103.

An output light with the wavelength of $\lambda 2$ of the light emitting element 105 is transmitted via the optical waveguide 102a and is reflected by the WDM filter 107. Then, it passes through the optical waveguide 102c and is guided into the optical fiber 101. For the purpose of achieving optical coupling of end surfaces of the core of the optical fiber 101 and the optical waveguide 102c, a V-shaped groove fabricated with high accuracy is formed on the Si substrate 103 with respect to the position of the optical waveguide 102. Then, the optical fiber 101 is aligned along the V-groove and fixed. On the other hand, a light signal with the wavelength of $\lambda 1$ transmitted from the optical fiber 101 is transmitted via the optical waveguide 102c and passes through the WDM filter 107, and it is received by the light receiving element 106 via the optical waveguide 102b. The light receiving element 106 is designed to have such a structure that it can receive the light when the light enters from lateral side of the chip.

The conventional module as described above have the following problems: The conventional module has the optical waveguide 102, and it requires complicated process not only to form the V-groove and the alignment markers 108 on the Si substrate 103 but also to provide the optical waveguide 102 with high accuracy. Further, the optical waveguides 102a, 102b and 102c are formed in star-like arrangement with the WDM filter 107 at the center. This means that the Si substrate 103 must have larger size, and it is difficult to produce the Si substrate 103 at low cost. Also, it is difficult to produce the module in small size.

The light receiving element 106 has such a structure that the light from the optical waveguide 102b enters side surface of the element of the chip. The optical waveguide 102b must be aligned with the light receiving element 106 with high accuracy in the order of 1 to 2 $\mu$m. In order to efficiently arrange the light receiving element 106 and the light emitting element 105 on the Si substrate 103, it is necessary to use high-temperature soldering reflow process. For this purpose, a resin having high heat-resistant property should be adopted for fixing optical components. Also, it is necessary to design the module with expensive ferrule to achieve reflow arrangement.

SUMMARY OF THE INVENTION

To solve the above problems in the conventional type module, it is an object of the present invention to provide a small size and inexpensive optical transmitting/receiving module without the need to use optical waveguide, which requires complicated process and larger area.

Also, it is another object of the present invention to provide a method for manufacturing an optical transmitting/receiving module, which can be produced by simplified manufacturing process.

To attain the above object, the optical transmitting/receiving module of the present invention comprises a substrate where there are provided a V-groove running in linear direction and a groove crossing said V-groove obliquely at an end of the V-groove, an optical fiber core is arranged to the end of said V-groove, a wavelength selective filter or a half-mirror is provided in said groove, and a light emitting element and a light receiving element are arranged respectively in transmitting direction and reflecting direction of the wavelength selective filter or the half-mirror.

By the above arrangement, it is possible to provide a small and inexpensive wavelength multiplexing optical transmitting/receiving module or a one-wavelength optical transmitting/receiving module without the need to use optical waveguide, which requires complicated manufacturing procedure.

According to another aspect of the present invention, an optical transmitting/receiving module as described above is provided, wherein a side surface of said groove runs in vertical direction, and said light receiving element is designed as end surface incident type.

By this arrangement, it is possible to improve optical coupling of the light receiving element and the optical fiber.

According to another aspect of the present invention, an optical transmitting/receiving module as described above is provided, wherein a side surface of said groove runs in oblique direction, and a second wavelength selective filter to shut off only wavelength of said light emitting element is arranged between said light receiving element and said wavelength selective filter.

By the arrangement as described above, it is possible to reduce light leakage of the light receiving element from the light emitting element. Also, the light receiving element, not of waveguide type but of front surface or rear surface incident type, can be used.

According to another aspect of the present invention, an optical transmitting/receiving module as described above is provided, wherein a light reflection surface of said wavelength selective filter or the half-mirror is fixed on side surface of the groove positioned opposite to the end surface of the optical fiber core.

By this arrangement, it is possible to accurately define the position of the wavelength selective filter or the half-mirror and to improve optical coupling efficiency to the light receiving element. Also, it is possible to increase width of the vertical groove or the oblique groove to a width greater than the thickness of the filter or the like, and this makes the insertion of the filter and the like much easier.

According to another aspect of the present invention, an optical transmitting/receiving module as described above is provided, wherein a light reflection surface of said wavelength selective filter or the half-mirror is brought into contact with and fixed on the side surface of said groove positioned opposite to the end surface of the optical fiber core.

By the arrangement as described above, it is possible to accurately define the position of the reflection surface without being influenced by variation in the thickness of the wavelength selective filter or the half-mirror, and to improve optical coupling efficiency to the light receiving element.

According to another aspect of the present invention, an optical transmitting/receiving module as described above is provided, wherein the end surface of the optical fiber is formed in oblique direction so that it runs approximately in parallel to the surface of the wavelength selective fiber or the half-mirror.

By the above arrangement, it is possible to minimize the distance between the end surface of the optical fiber and the filter and to improve optical coupling efficiency.

According to another aspect of the present invention, an optical transmitting/receiving module as described above is provided, wherein the surface of said light emitting element positioned opposite to said wavelength selective filter or the half-mirror is designed to run in oblique direction.

By this arrangement, it is possible to improve optical coupling efficiency of the light emitting element.

According to another aspect of the present invention, an optical transmitting/receiving module as described above is provided, wherein the surface of the light emitting element where an active layer is not exposed to outside is formed in oblique direction.

By this arrangement, the light emitting element can be brought closer to the filter and the like, and optical coupling efficiency can be improved.

According to another aspect of the present invention, an optical transmitting/receiving module as described above is provided, wherein the active layer of said light emitting element is displaced in a direction perpendicular to the optical axis, and said light emitting element is arranged in such position that the distance between said active layer and said wavelength selective filter or the half-mirror will be shorter.

By this arrangement, it is possible to improve optical coupling efficiency of the light emitting element without the need to fabricate the light emitting element in oblique direction.

According to another aspect of the present invention, an optical transmitting/receiving module as described above is provided, wherein the surface of said light receiving element positioned opposite to the wavelength selective filter or the half-mirror is formed in oblique direction.

By this arrangement, it is possible to improve optical coupling efficiency of the light receiving element.

The present invention provides a method for manufacturing an optical transmitting/receiving module, which comprises a substrate where there are provided a V-groove running in linear direction and a groove crossing said V-groove obliquely at an end of the V-groove, an optical fiber core is arranged to the end of said V-groove, a wavelength selective filter or a half-mirror is provided in said groove, and a light emitting element and a light receiving element are arranged respectively in transmitting direction and reflecting direction of the wavelength selective filter or the half-mirror, said method comprising the steps of:
  inserting said wavelength selective filter or said half-mirror into said groove and fixing; and
  positioning the end surface of said optical fiber core and said filter or the half-mirror by advancing the forward end of the optical fiber core along said V-groove until it reaches the filter or the half-mirror.

By this method, it is possible to perform alignment of the wavelength selective filter or the half-mirror accurately by utilizing the process to fix the optical fiber.

Also, the present invention provides a method for manufacturing the optical transmitting/receiving module as described above, said method comprising the steps of:
  applying a resin having refractive index equal to that of the optical fiber to the end surface of the optical fiber;
  temporarily fixing the end surface of the optical fiber to the wavelength selective filter or the half-mirror by utilizing adhesive strength of said resin not yet hardened; and
  hardening said resin and fixing it to the end surface of the optical fiber positioned in said V-groove.

By this method, it is possible to fix the wavelength selective filter or the half-mirror between the optical fiber and the vertical groove or the oblique groove accurately and easily even when the wavelength selective filter or the half-mirror is in small size. Also, it is possible to produce the filter and other components at lower cost because these are in smaller size.

Also, the present invention provides a method for manufacturing the optical transmitting/receiving module as described above, said method comprising the steps of:
  advancing the end surface of said optical fiber core along said V-groove until an edge of the end surface reaches the side surface of said groove; and
  advancing said wavelength selective filter or said half-mirror along said groove until its tip reaches the end surface of the optical fiber core, and aligning the position of the optical fiber core with that of the wavelength selective filter or the half-mirror.

By this method, it is possible to shorten the distance between the fiber end and the light emitting element and to improve optical coupling efficiency of the light emitting element.

According to another aspect of the present invention, it is designed in such manner that wherein said optical fiber and said wavelength selective filter or the half-mirror are fixed at the same time by filling a resin having refractive index equal to that of the optical fiber into optical path near the end of the optical fiber and hardening said resin.

By this arrangement, it is possible to reduce reflection loss between the optical fiber and the air layer.

According to still another aspect of the present invention, the invention provides an optical transmitting/receiving module as described above, wherein said substrate is made of a semiconductor material, and said V-groove and the groove are formed at the same time by anisotropic wet etching process or by dry etching process, or formed at the same time by using a dicing saw.

By this method, it is possible to form the vertical groove or the oblique groove at the same time as the V-groove, and it is possible to form these grooves much easier.

BRIEF DESCRIPTION OF THE DRAWINGS

FIG. 2A is a side view seen from left of a V-groove and a vertical groove of the embodiment of FIG. 1, showing a method for forming such grooves;

FIG. 2B is a plan view of a V-groove and a vertical groove of the embodiment of FIG. 1, showing a method for forming such grooves;

FIG. 2C is a front view of a V-groove and a vertical groove of the embodiment of FIG. 1, showing a method for forming such grooves;

FIG. 3 is an enlarged view, showing a region near tip of an optical fiber of the first embodiment of the present invention;

FIG. 4A is a process drawing, showing a method for fixing a filter in the first embodiment of the present invention, and it represents a process for coating an adhesive agent;

FIG. 4B is a process drawing, showing a method for fixing a filter in the first embodiment of the present invention, and it represents a process for temporarily fixing the filter;

FIG. 4C is a process drawing, showing a method for fixing a filter in the first embodiment of the present invention, and it represents a process for fixing the filter;

DETAILED DESCRIPTION OF THE PREFERRED EMBODIMENTS (Embodiment 1)

Figure 1:
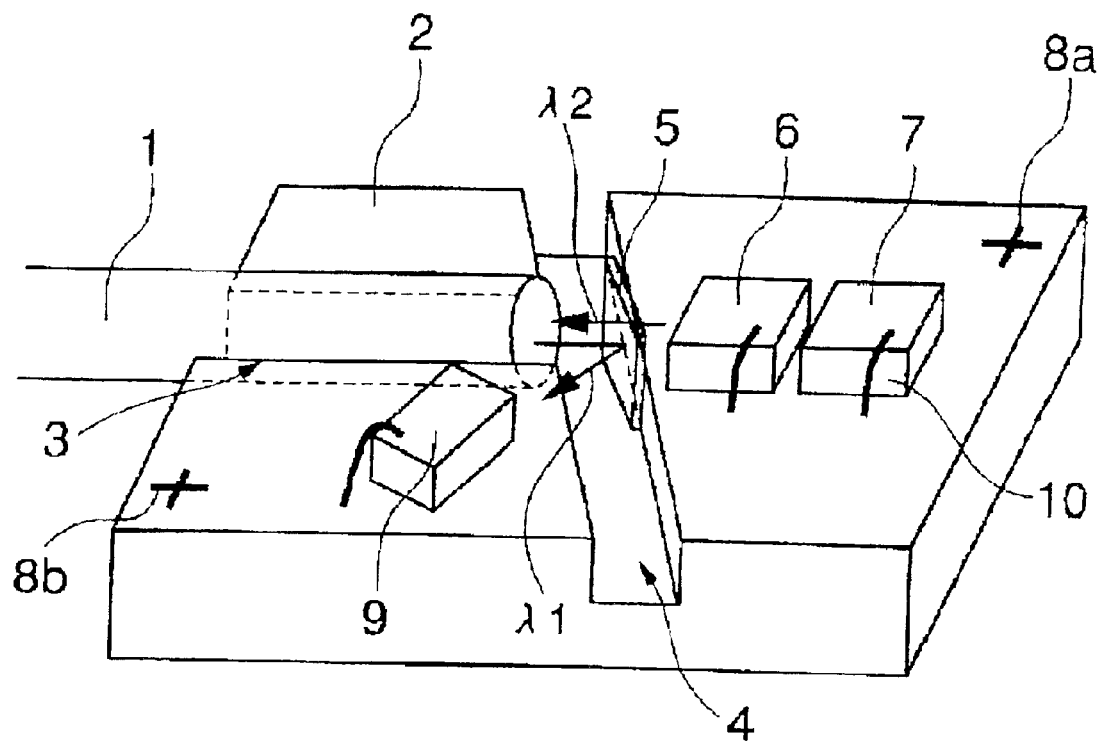
FIG. 1 is a perspective view, showing a wavelength multiplexing optical transmitting/receiving module of a first embodiment of the present invention.

Description will be given below on embodiments of the present invention referring to the drawings. FIG. 1 is a perspective view, showing an arrangement of a wavelength multiplexing transmitting/receiving module of the Embodiment 1 of the present invention. FIGS. 2A, 2B and 2C each represents a V-groove and a vertical groove of the embodiment shown in FIG. 1 and a method for forming the grooves.

In FIG. 1, on a Si substrate 2, there are provided a V-groove 3 positioned with high accuracy with respect to alignment markers 8a and 8b, and a vertical groove 4 (a groove having vertical side surfaces) obliquely crossing the V-groove 3 at an end thereof. On the Si substrate 2, a light emitting element 6 and a light receiving element 7 for monitoring are positioned with high accuracy using the alignment markers 8a and 8b on an extension line extended in the direction of the V-groove 3. On the Si substrate 2, there are also provided a light receiving element 9, which is positioned by the alignment markers 8 in the same manner on an extension line extended in a direction, in which exit light from an optical fiber 1 is reflected by a wavelength selective filter 5. As the light receiving element 9, an element of end surface incident structure is used.

The wavelength selective filter 5 is fixed on a vertical side of the vertical groove 4 relatively away from the V-groove 3. The position of the wavelength selective filter 5 is defined by one vertical side surface of the vertical groove 4. In this connection, width of the vertical groove 4 can be increased so that the wavelength selective filter 5 can be easily inserted. It is designed in such manner that height of an incident part of the light receiving element 9 and an exit part of the light emitting element 6, height of the wavelength selective filter 5, and height of a core of the optical fiber 1 fixed in the V-groove 3 are all set on the same level.

As shown in FIG. 1, a light beam with wavelength $\lambda 1$ transmitted via the optical fiber 1 is reflected by the wavelength selective filter 5 and enters the light receiving element 9. A light beam with wavelength $\lambda 2$ of the light emitting element 6 passes through the wavelength selective filter 5 and enters the optical fiber 1. Therefore, it is possible to form an optical transmitting/receiving module in compact size, and it requires fewer components without the need to use a conventional type optical waveguide. Also, these components can be positioned with high accuracy using the alignment markers 8 on the Si substrate 2 as reference.

Referring to FIGS. 2A to 2C, description will be given on a method to form the V-groove 3 and the vertical groove 4 on the Si substrate 2 in the Embodiment 1 of the present invention. FIG. 2A is a side view seen from left, FIG. 2B is a plan view, and FIG. 2C is a front view. A resist pattern 11 for etching is formed using a mask, which has an opening for planar shape of the V-groove 3 and the vertical groove 4. By anisotropic wet etching, a V-shaped groove 3 and a vertical groove (a groove having vertical side surfaces) running obliquely at an angle of 45° with respect to the V-groove are formed. The vertical groove 4 may be formed vertically by dry etching instead of wet etching. When dry etching is used, the angle to the V-groove 3 is not limited to 45° but the vertical groove can be formed at any angle as desired. Also, it is possible to form the vertical grove 4 in a process to divide the Si substrate by dicing instead of etching.

FIG. 3 is an enlarged view of tip of an optical fiber in the Embodiment 1 of the present invention. The side of the wavelength selective filter 5 where a reflection film 12 is formed is fixed so that it is brought into contact with a side surface of the vertical groove 4. The optical fiber 1 is fabricated in advance so that its end surface runs in oblique direction, and tip surface of the fiber is fixed in such manner that it contacts the wavelength selective filter 5. As a result, regardless of the thickness of the wavelength selective filter 5, the position of the reflection light of the optical signal $\lambda 1$ is determined by positional accuracy of the side surface of the vertical groove 4. Also, it is possible to minimize a distance between the core of the optical fiber 1 and the wavelength selective filter 5, and optical coupling efficiency to the light receiving element 9 is increased.

FIG. 4A to FIG. 4C each represents a method to fix the optical fiber 1 and the wavelength selective filter 5 in the Embodiment 1 of the present invention. According to this fixing method, the thin and small wavelength selective filter 5 can be easily inserted. As shown in FIG. 4A, a resin 13 such as UV-setting resin having refractive index equal to that of the optical fiber 1 is coated on an end surface of the optical fiber 1. Next, as shown in FIG. 4B, tip of the resin 13 is brought into contact with the wavelength selective filter 5 before the resin 13 is hardened, and the thin and small wavelength filter 5 can be temporarily fixed to the tip of the optical fiber. Then, as shown in FIG. 4C, the optical fiber 1 and its tip are inserted into the V-groove 3 and the vertical groove 4. By irradiating ultraviolet ray, the resin 13 is hardened, and the wavelength selective filter 5 and the optical fiber 1 can be fixed.

Figure 5:
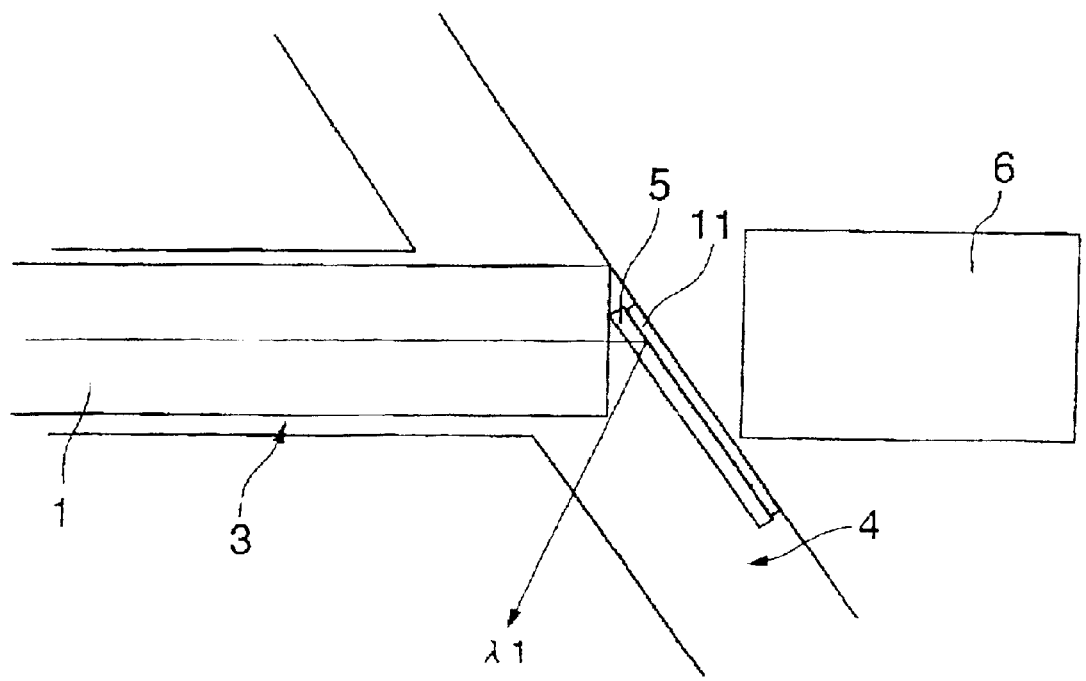
FIG. 5 is an enlarged view, showing a region near tip of another optical fiber in the first embodiment of the present invention.

FIG. 5 is an enlarged view of a region near the tip of the optical fiber in a variation of the embodiment of the present invention. First, the optical fiber 1 is advanced along the V-groove 3, and edge of the end surface, fabricated perpendicularly to the axis of the optical fiber 1, is pressed against the side surface of the vertical groove 4. Then, the wavelength selective filter 5 is advanced along the vertical groove 4, and it is inserted in such manner that reflection surface of the reflection film 12 is brought into contact with the side surface of the vertical groove 4 and that the opposite surface of the reflection surface of the reflection film 12 contacts the end surface of the optical fiber 1. In FIG. 3, if the wavelength selective filter 5 is thick, optical path of the reflection light λ2 becomes longer. As it is seen in FIG. 5, the influence of the thickness of the wavelength selective filter 5 can be minimized.

Figure 6:
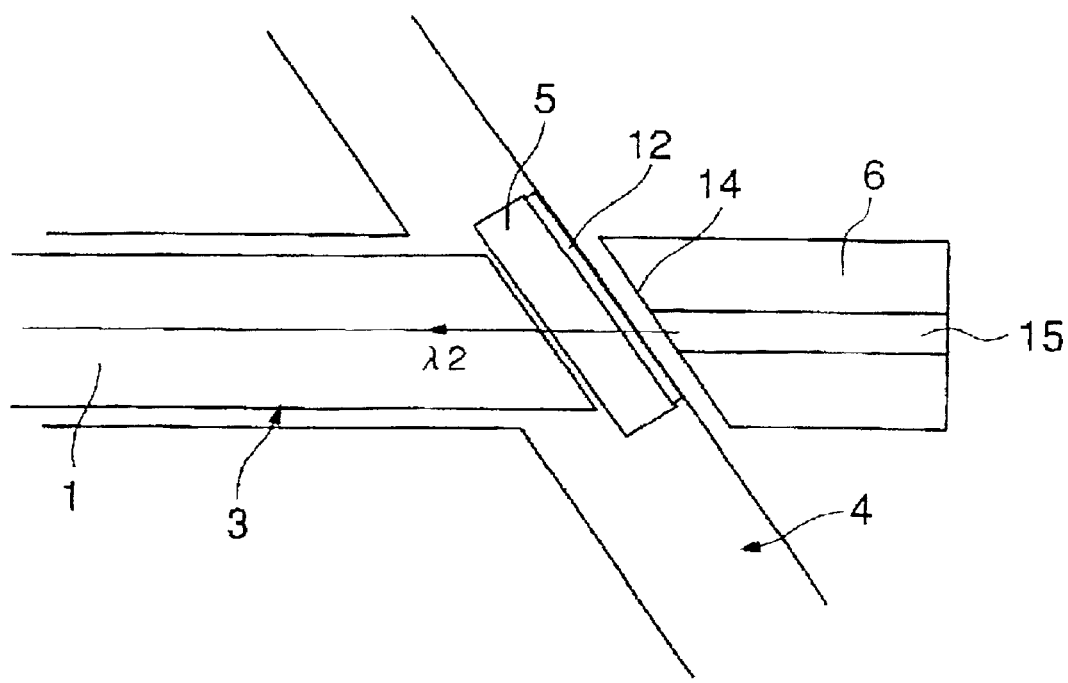
FIG. 6 is an enlarged view, showing a region near tip of still another optical fiber in the first embodiment of the present invention.

FIG. 6 is an enlarged view of a region near the tip of the optical fiber in another variation of the Embodiment 1 of the present invention. An end surface 14 of the light emitting element 6 closer to the wavelength selective filter 5 is fabricated to have its surface in oblique direction and the light emitting element 6 is positioned as shown in FIG. 6. A distance between the end surface of an active layer 15 of the light emitting element 6 and the wavelength selective filter 5 is shortened, and this contributes to the increase of optical coupling efficiency of the light emitting element 6. As the light emitting element 6, the means such as Fabry-Perot (FP) laser, utilizing vertical end surface, cannot be used, but the end surface may be fabricated so that it runs in oblique direction. For instance, distributed feedback (DFB) laser can be used.

Figure 7:
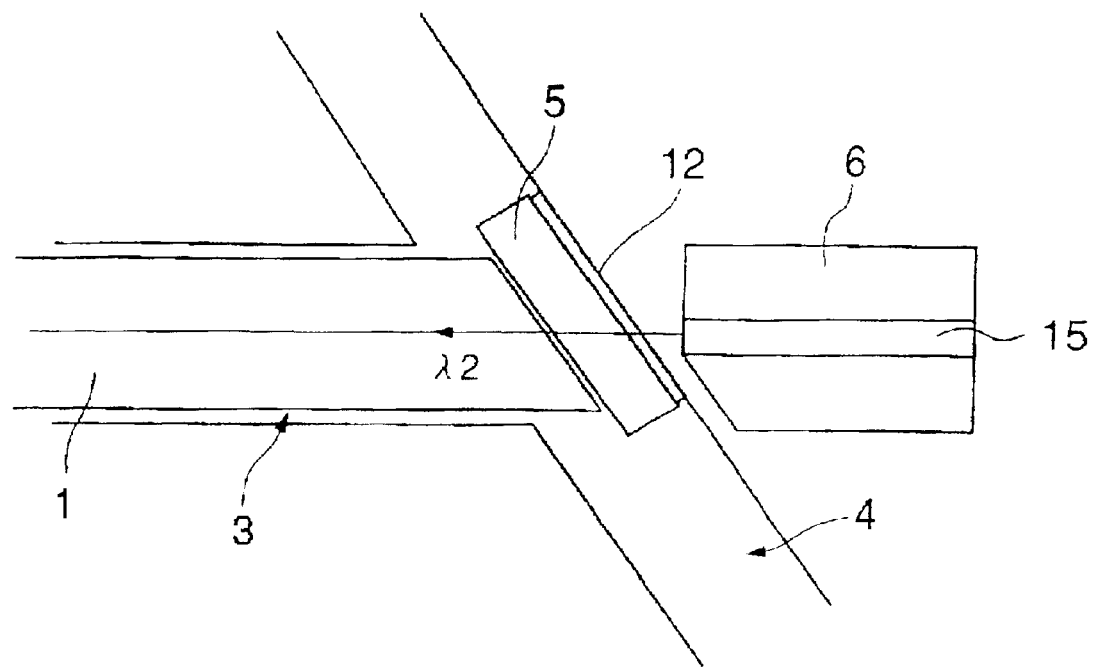
FIG. 7 is an enlarged view, showing a region near tip of yet still another optical fiber in the first embodiment of the present invention.

FIG. 7 is an enlarged view of a region near the tip of the optical fiber in still another variation of the Embodiment 1 of the present invention. The end surface of the light emitting element 6 closer to the wavelength selective filter 5 is fabricated so that a part of the end surface runs in oblique direction, and the light emitting element 6 is arranged by aligning the optical fiber 1 and the active layer 15 to minimize the distance between the end surface of the active layer 15 and the wavelength selective filter 5. That is, to ensure the flatness of the active layer 15, only a part of the end surface of the light emitting element 6 is fabricated in oblique direction. Unlike the case shown in FIG. 6, the end surface of the active layer 15 is not running in oblique direction, and this can be applied to the case where FP laser is used.

Figure 8:
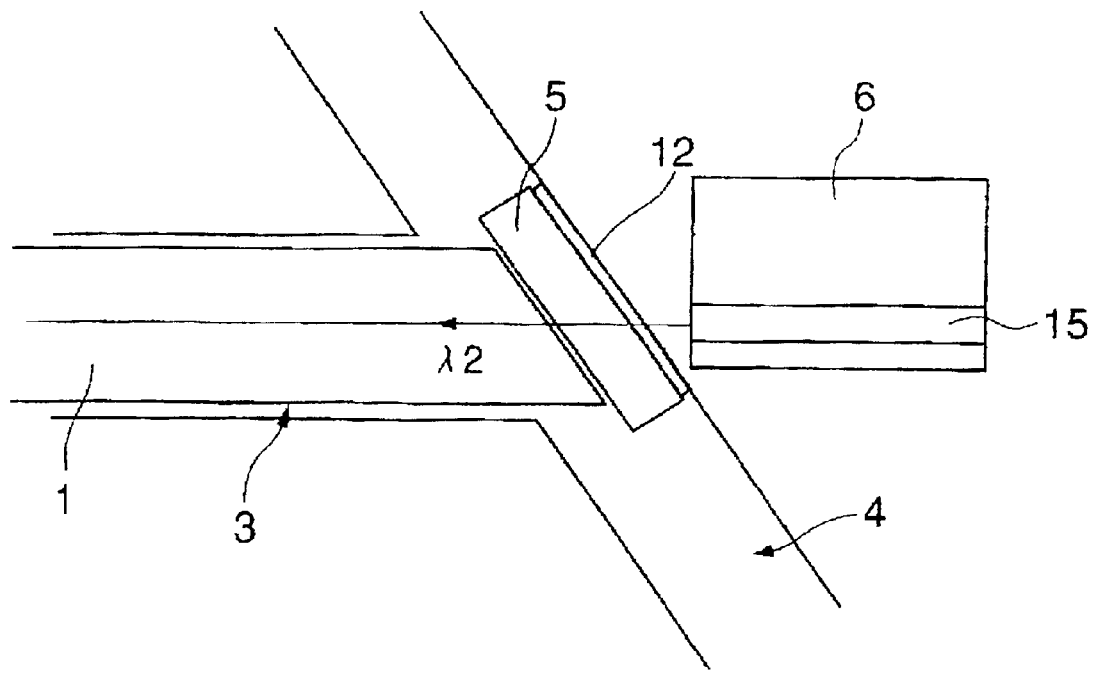
FIG. 8 is an enlarged view, showing a region near tip of yet still another optical fiber in the first embodiment of the present invention.

FIG. 8 is an enlarged view of a region near the tip of the optical fiber in still another variation of the Embodiment 1 of the present invention. It is designed in such manner that the active layer 15 of the light emitting element 6 is positioned away from the center of the light emitting element 6 or that the active layer 15 is positioned near the side surface when the chip is separated. Then, the light emitting element 6 is positioned by aligning the positions of the optical fiber 1 and the active layer 15. As a result, similar effect as in the cases shown in FIG. 6 and FIG. 7 can be obtained without the need to fabricate the end surface in oblique direction.

Figure 9:
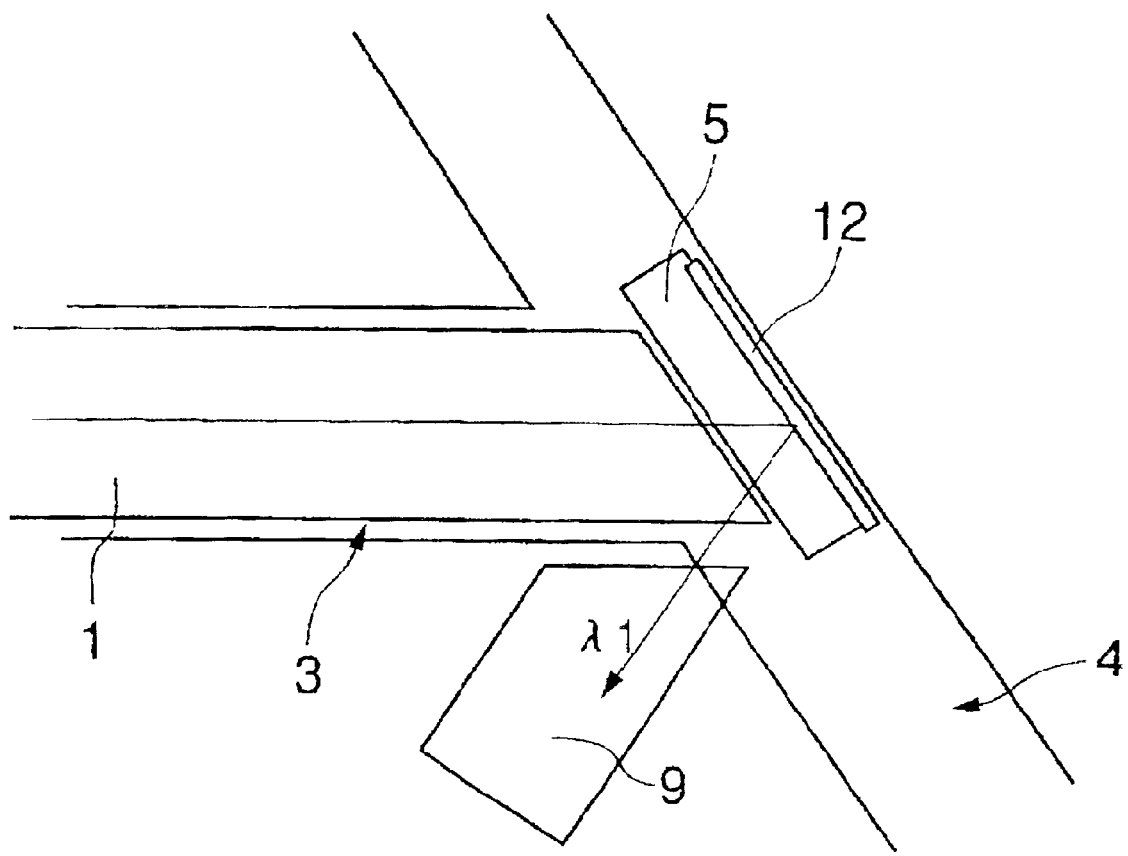
FIG. 9 is an enlarged view, showing a light receiving side of tip of the optical fiber in the first embodiment of the present invention.

FIG. 9 is an enlarged view of a region near a light receiving part at the tip of the optical fiber in the Embodiment 1 of the present invention. Similarly to the case shown in FIG. 6, the end surface of the light receiving element 9 is fabricated so that it runs in oblique direction. This is to shorten the distance between the light receiving element 9 and the wavelength selective filter 5, and this contributes to the increase of light coupling efficiency of the light receiving element 9.

(Embodiment 2)

Figure 10A:
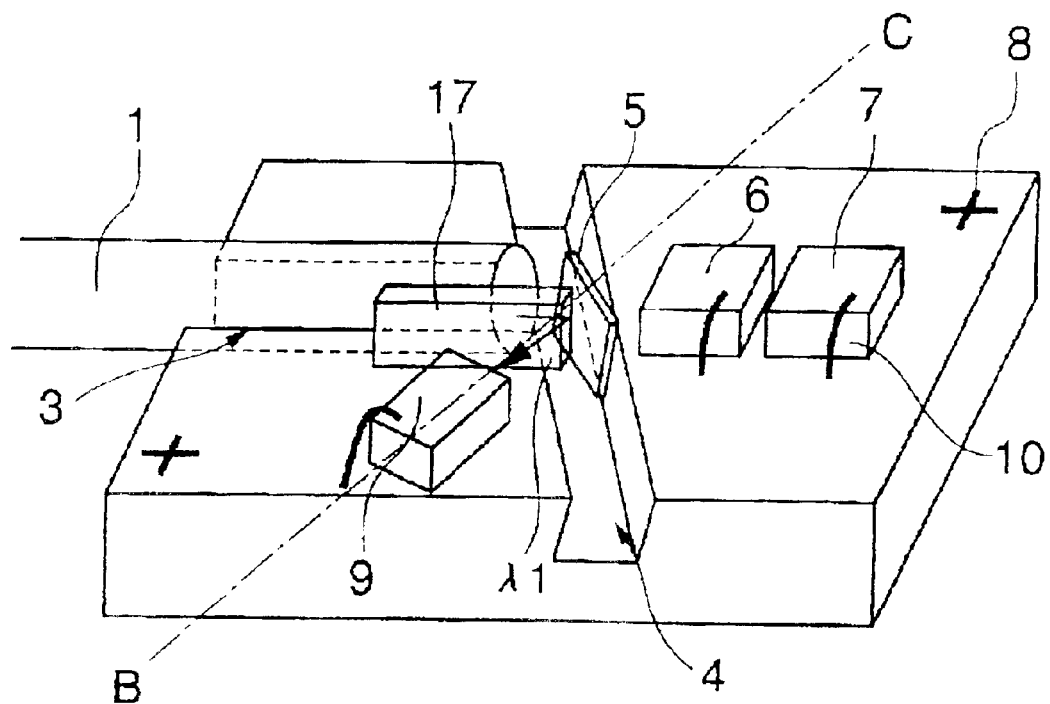
FIG. 10A is a perspective view of a wavelength multiplexing optical transmitting/receiving module of a second embodiment of the present invention.
Figure 10B:
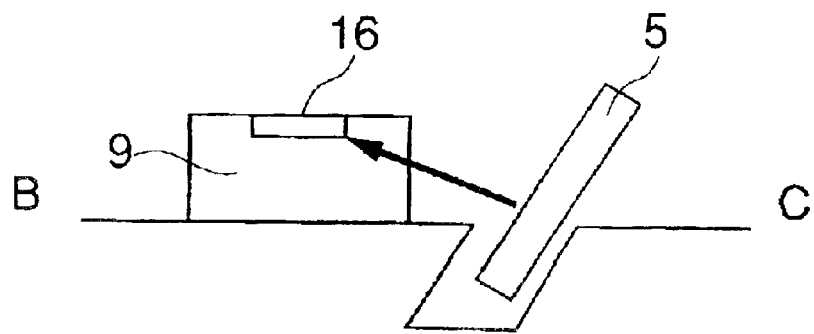
FIG. 10B is a front view of a wavelength multiplexing optical transmitting/receiving module of a second embodiment of the present invention.
Figure 11:
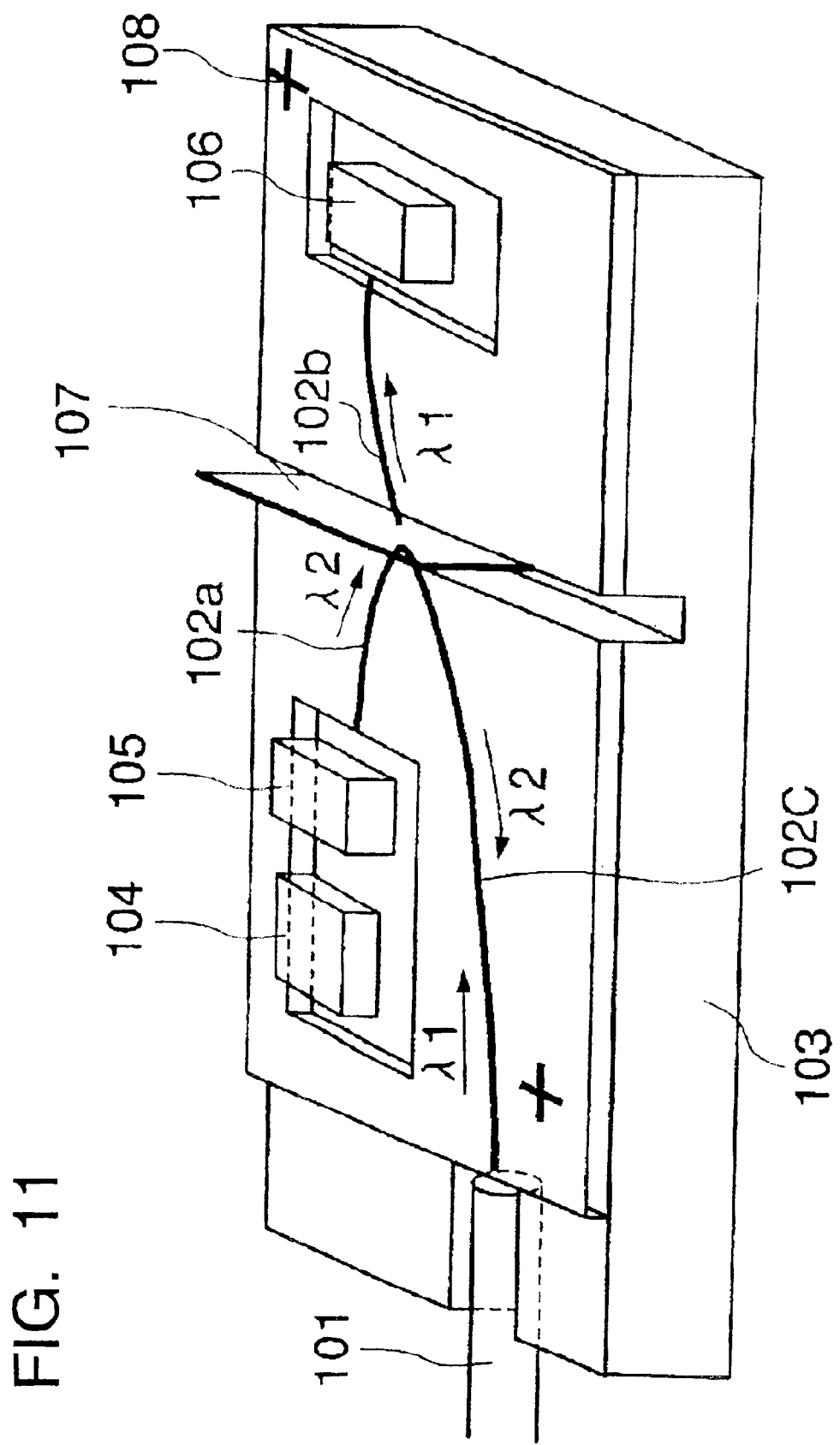
FIG. 11 is a block diagram of a conventional type wavelength multiplexing optical transmitting/receiving module.

FIG. 10A and FIG. 10B represents respectively a structural drawing of a wavelength multiplexing optical transmitting/receiving module and a cross-sectional view of a light receiving element of the Embodiment 2 of the present invention. Basic arrangement of this embodiment is the same as that of the Embodiment 1, while the difference is as follows: Instead of the vertical groove 4, a groove 4a with its side surfaces running in oblique direction is formed by a method such as dicing. The wavelength selective filter 5 is positioned obliquely with respect to a substrate 2, and a light beam with wavelength λ2 is reflected obliquely in upper direction. As shown in FIG. 10B, the light is received by the light receiving element 9 of front surface or rear surface incident type, which has a light receiving part 16 on its upper surface.

In the Embodiment 1, in order that the light is irradiated from the lowermost end of the light receiving element 9, it is necessary to use a light receiving element of special structure such as an optical waveguide type or a front surface or rear surface incident type light receiving element with a fabricated end surface. In the Embodiment 2 as described above, a light receiving element commonly used in the past can be used. Also, as shown in FIG. 10A, a second wavelength selective filter 17 to shut off only the light with wavelength of λ2 from the light emitting element 6 is inserted between the light receiving element 9 and the wavelength selective filter 5. In so doing, optical isolation between transmitting and receiving can be improved.

In the above Embodiment, description has been given on a case where the wavelength selective filter 2 is inserted into a slit 16 to provide a wavelength multiplexing module, which allows to pass and divides the light beam with two wavelengths. A half-mirror may be used instead of the wavelength selective filter 2, and it is possible to apply to an optical transmitting/receiving module, which allows to pass and reflects the light with one wavelength.

As described above, according to the present invention, a wavelength selective filter or a half-mirror is arranged in a groove, which crosses a V-groove obliquely at the end of the V-groove, and a light emitting element and a light receiving element are arranged respectively in transmitting direction and reflecting direction of the wavelength selective filter or the half-mirror. As a result, there is no need to provide an optical waveguide, which requires complicated manufacturing procedure, and it is possible to have a small and low-cost wavelength multiplexing optical transmitting/receiving module or an optical transmitting/receiving module, which transmits and reflects the light with one wavelength.

Also, according to another aspect of the present invention, it is designed in such manner that the side surface of the groove runs in vertical direction and the light receiving element is designed as end surface incident type, and this contributes to the improvement of the optical coupling between the light receiving element and the optical fiber.

According to still another aspect of the present invention, the side surface of the groove runs obliquely and a second wavelength selective filter to shut off only the wavelength of the light emitting element is arranged between the light receiving element and the wavelength selective filter. As a result, it is possible to minimize light leakage of the light receiving element from the light emitting element, and a light receiving element, not of waveguide type but of front surface or rear surface incident type, can be used.

Further, according to still another aspect of the present invention, it is possible to accurately define the position of the wavelength selective filter or the half-mirror and to improve optical coupling efficiency to the light receiving element. Also, width of the vertical groove or the oblique groove can be increased to a width greater than the thickness of the filter, and this makes it possible to insert the filter and the like much easier.

Also, according to still another aspect of the present invention, the position of the reflection surface can be accurately defined without being influenced from variation in thickness of the wavelength selective filter or the half-mirror, and it is possible to improve optical coupling efficiency to the light receiving element.

Further, according to still another aspect of the present invention, the distance between end surface of the optical fiber and the filter can be decreased, and this contributes to the improvement of optical coupling efficiency.

Also, according to still another aspect of the present invention, the optical coupling efficiency of the light emitting element can be increased without the need to fabricate the surface of the light emitting element in oblique direction.

Further, according to still another aspect of the present invention, the optical coupling efficiency of the light receiving element can be increased.

Also, according to still another aspect of the present invention, the wavelength selective filter or the half-mirror can be accurately positioned by utilizing the process to fix the optical fiber.

Further, according to still another aspect of the present invention, the wavelength selective filter or the half-mirror can be accurately and easily inserted between the optical fiber and the vertical groove or the oblique groove even when the wavelength selective filter or the half-mirror is in very small size. Also, it is possible to obtain the filter and the like at lower cost because these can be produced in smaller size.

Also, according to still another aspect of the present invention, the distance between the end of the optical fiber and the light emitting element can be made shorter, and this contributes to the improvement of optical coupling efficiency of the light emitting element.

Further, according to still another aspect of the present invention, reflection loss between the optical fiber and the air layer can be reduced.

Also, according to still another aspect of the present invention, the vertical groove or the oblique groove can be formed at the same time as the V-groove, and it is possible to form these grooves much easier.

What is claimed is:

1. An optical transmitting/receiving module, comprising:
   a substrate having a flat surface, in which a linear V-groove and a groove are formed in such a manner that both said V-groove and said groove are facing said flat surface, said groove crossing obliquely said V-groove at an end of said V-groove, an optical fiber core being received in said V-groove in such a manner that an end of said optical fiber core is positioned at one end of said V-groove at which said groove crosses, said groove having a side surface which is not perpendicular to optical axis of said optical fiber core;
   a wavelength selective filter or a half-mirror received in said groove;
   a light emitting element arranged on said flat surface of said substrate at a position corresponding to an extension of said optical fiber core in transmitting direction of said wavelength selective filter or said half-mirror such that a light is transmitted from said light emitting element to said wavelength selective filter or said half-mirror without propagating through a waveguide; and
   a light receiving element arranged on said flat surface of said substrate in reflecting direction of said wavelength selective filter or said half-mirror such that a light is transmitted from said wavelength selective filter or said half-mirror to said light emitting element without propagating through a waveguide.

2. The optical transmitting/receiving module according to claim 1, wherein a side surface of said groove is perpendicular to said flat surface of said substrate, and said light receiving element is designed as end surface incident type.

3. The optical transmitting/receiving module according to claim 1, wherein a side surface of said groove is oblique to said flat surface of said substrate, and a second wavelength selective filter to shut off only wavelength of said light emitting element is arranged between said light receiving element and said wavelength selective filter.

4. The optical transmitting/receiving module according to claim 1, wherein a light reflection surface of said wavelength selective filter or said half-mirror is fixed on side surface of the groove positioned opposite to the end surface of the optical fiber core, and a part of said wavelength selective filter or said half-mirror is projecting beyond said flat surface of said substrate.

5. The optical transmitting/receiving module according to claim 1, wherein a light reflection surface of said wavelength selective filter or said half-mirror is brought into contact with and fixed on the side surface of said groove positioned opposite to the end surface of the optical fiber core.

6. The optical transmitting/receiving module according to claim 1, wherein the end surface of the optical fiber is formed in oblique direction so that it runs approximately in parallel to the surface of said wavelength selective fiber or said half-mirror.

7. The optical transmitting/receiving module according to claim 1, wherein a light emitting surface of said light emitting element facing said wavelength selective filter or said half-mirror is not perpendicular to a direction of an emitting light from said light emitting element.

8. The optical transmitting/receiving module according to claim 1, wherein a light emitting surface of the light emitting element facing said wavelength selective filter or said half-mirror is perpendicular to a direction of an emitting light from said light emitting element, and at least a part of a corner edge of said light emitting element has a surface which is oblique to said light emitting surface.

9. The optical transmitting/receiving module according to claim 1, wherein said light emitting element includes a linear active waveguide poisoned in the vicinity of a bottom surface of said light emitting element and in the vicinity of one of two side surfaces of said light emitting element where said two side surfaces are parallel to an axis of light emitted from said light emitting element.

10. The optical transmitting/receiving module according to claim 1, wherein a light emitting surface of said light receiving element facing said wavelength selective filter or said half-mirror is not perpendicular to an axis of a reflected light from said wavelength selective filter or said half-mirror.

* * * * *